United States Patent
Kinsley et al.

(10) Patent No.: US 11,789,890 B2
(45) Date of Patent: *Oct. 17, 2023

(54) MEMORY DEVICES, MODULES AND SYSTEMS HAVING MEMORY DEVICES WITH VARYING PHYSICAL DIMENSIONS, MEMORY FORMATS, AND OPERATIONAL CAPABILITIES

(71) Applicant: Lodestar Licensing Group LLC, Evanston, IL (US)

(72) Inventors: Thomas H. Kinsley, Boise, ID (US); George E. Pax, Lake City, FL (US); Timothy M. Hollis, Meridian, ID (US); Yogesh Sharma, Boise, ID (US); Randon K. Richards, Kuna, ID (US); Chan H. Yoo, Boise, ID (US); Gregory A. King, Hastings, MN (US); Eric J. Stave, Meridian, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/850,927

(22) Filed: Jun. 27, 2022

(65) Prior Publication Data

US 2022/0335000 A1 Oct. 20, 2022

Related U.S. Application Data

(63) Continuation of application No. 16/720,976, filed on Dec. 19, 2019, now Pat. No. 11,416,437.

(Continued)

(51) Int. Cl.
*G06F 13/42* (2006.01)
*G06F 11/10* (2006.01)
*G11C 7/10* (2006.01)

(52) U.S. Cl.
CPC ...... *G06F 13/4234* (2013.01); *G06F 11/1068* (2013.01); *G11C 7/10* (2013.01)

(58) Field of Classification Search
CPC .... G06F 13/4234; G06F 11/1068; G11C 7/10
See application file for complete search history.

(56) References Cited

U.S. PATENT DOCUMENTS

| 5,865,873 A | 2/1999 | Sekine et al. |
| 7,225,292 B2 | 5/2007 | Ware et al. |

(Continued)

FOREIGN PATENT DOCUMENTS

| CN | 103219043 A | 7/2013 |
| KR | 20140078912 A | 6/2014 |

OTHER PUBLICATIONS

International Application No. PCT/US2019/067534—International Search Report and Written Opinion, dated Apr. 23, 2020, 10 pages.

(Continued)

*Primary Examiner* — Kyle Vallecillo
(74) *Attorney, Agent, or Firm* — Holland & Hart LLP

(57) ABSTRACT

An apparatus is provided, comprising a plurality of memory devices and a buffering device that permits memory devices with a variety of physical dimensions and memory formats to be used in an industry-standard memory module format. The buffering device includes memory interface circuitry and at least one first-in first-out (FIFO) or multiplexer circuit. The apparatus further comprises a parallel bus connecting the buffering device to the plurality of memory devices. The parallel bus includes a plurality of independent control lines, each coupling the memory interface circuitry to a corresponding subset of a plurality of first subsets of the plurality of memory devices. The parallel bus further includes a plurality of independent data channels, each coupling the at least one FIFO circuit or multiplexer circuit to a corresponding subset of a plurality of second subsets of the plurality of memory devices.

21 Claims, 4 Drawing Sheets

Related U.S. Application Data

(60) Provisional application No. 62/782,276, filed on Dec. 19, 2018.

(56) References Cited

U.S. PATENT DOCUMENTS

| | | |
|---|---|---|
| 7,493,426 B2 | 2/2009 | Chadha et al. |
| 2004/0186956 A1 | 9/2004 | Perego et al. |
| 2008/0034130 A1 | 2/2008 | Perego et al. |
| 2008/0172515 A1 | 7/2008 | Croxford |
| 2009/0019184 A1 | 1/2009 | Skerlj et al. |
| 2010/0002503 A1 | 1/2010 | Koebernik et al. |
| 2010/0110916 A1 | 5/2010 | Pratt, Jr. et al. |
| 2012/0185663 A1 | 7/2012 | Yokoya et al. |
| 2015/0302904 A1 | 10/2015 | Yoon et al. |
| 2017/0255552 A1 | 9/2017 | Chatterjee et al. |
| 2019/0205225 A1* | 7/2019 | Kim .................. G06F 13/4239 |
| 2020/0201807 A1 | 6/2020 | Kinsley et al. |

OTHER PUBLICATIONS

EP Patent Application No. 19899954.2—Extended European Search Report, dated Aug. 5, 2022, 8 pages.
Office Action dated Mar. 14, 2023 for Chinese Patent Application No. 201980009891.8, 11 pages (with translation).

\* cited by examiner

MEMORY DEVICES, MODULES AND SYSTEMS HAVING MEMORY DEVICES WITH VARYING PHYSICAL DIMENSIONS, MEMORY FORMATS, AND OPERATIONAL CAPABILITIES

CROSS-REFERENCE TO RELATED APPLICATIONS

This application is a continuation of U.S. application Ser. No. 16/720,976, filed Dec. 19, 2019; which claims the benefit of U.S. Provisional Application No. 62/782,276, filed Dec. 19, 2018; each of which is incorporated herein by reference in its entirety.

TECHNICAL FIELD

The present disclosure generally relates to memory devices, modules and systems, and more particularly to memory devices, modules and systems with varying physical dimensions, memory formats, and operational capabilities.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE FIGURES AND APPENDIX

DETAILED DESCRIPTION

High data reliability, high speed of memory access, and reduced chip size are features that are demanded from semiconductor memory. Semiconductor memory is frequently provided in memory modules corresponding to industry standards, such as dual in-line memory modules (DIMM). The industry standards frequently require specific module dimensions (e.g., maximum heights and thicknesses) as well as specific connector layouts. These constraints can pose challenges to providing higher-density, mixed-media, and other high-performance memory modules, as the total space in which to provide memory devices is strictly limited.

Accordingly, several embodiments of the present technology are directed to memory devices, memory systems and memory modules in which dynamic densities are enabled. In this regard, a memory module can be provided with a buffering device between the module connector and the memory devices that permits memory devices with a variety of physical dimensions (e.g., chip-scale packaging) and memory formats (e.g., volatile and non-volatile) to be used in an industry-standard format. The buffering device can be configured to support memory devices with less on-board features (e.g., "dumb" memory arrays, in which logic functions are offloaded to the buffering device). The buffering device can be further configured to support atomic in-memory operations, in-memory processing, and the like. The buffering device can perform the functions, and therefore physically replace, other module components such as registering clock drivers (RCDs) and buffers (e.g., LRDIMM buffers).

Figure 1:
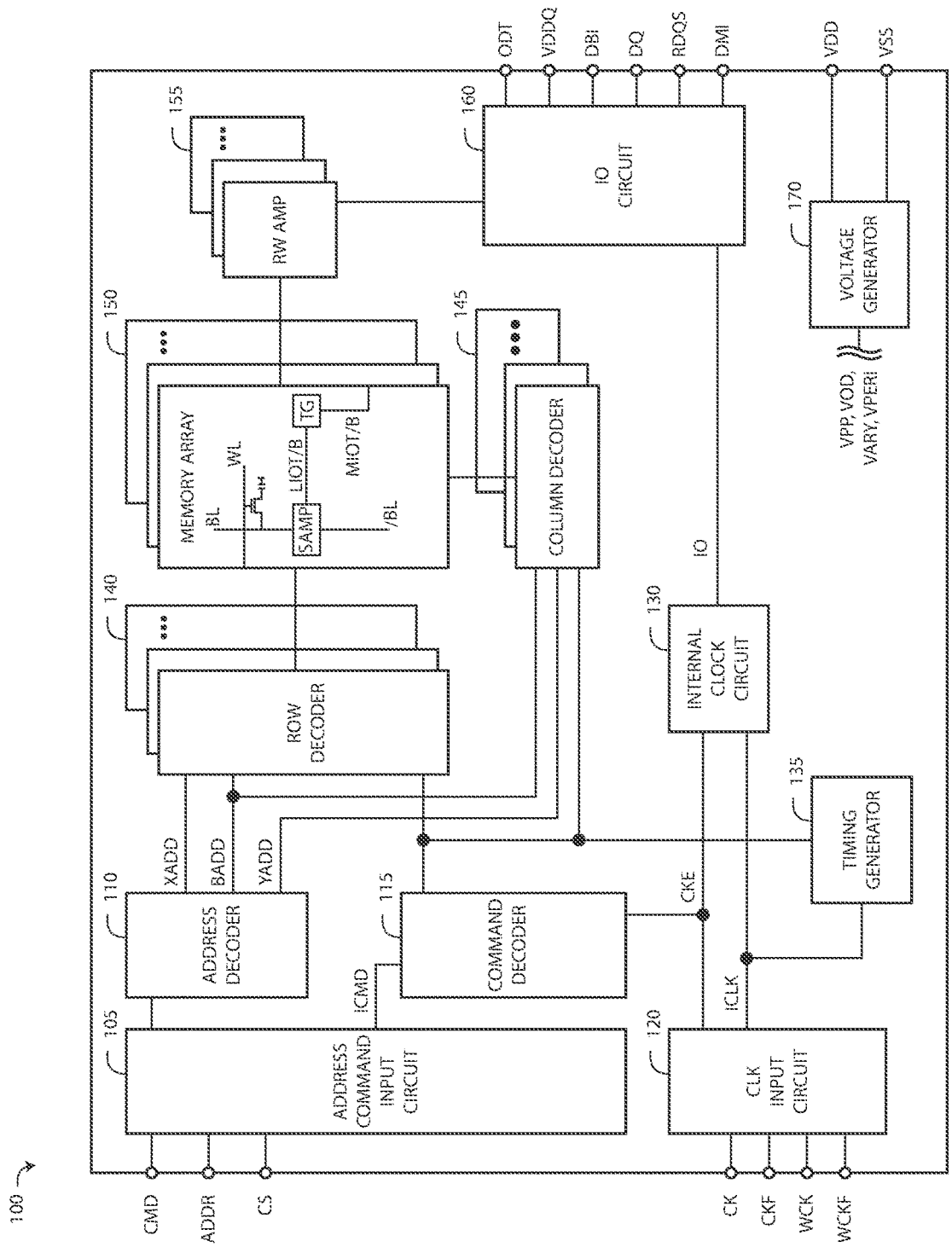
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Figure 2:
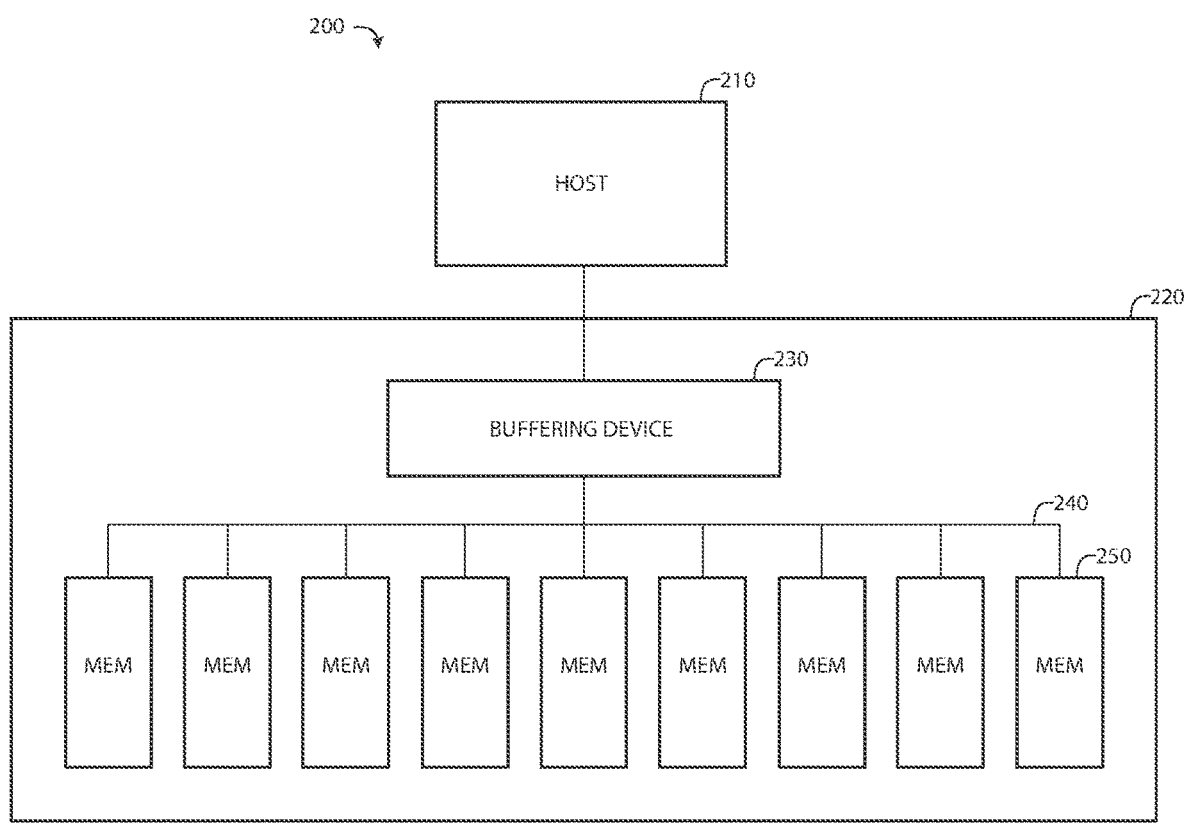
FIG. 2 is a simplified block diagram schematically illustrating a memory system in accordance with an embodiment of the present technology.

Memory devices such as the memory device 100 illustrated in FIG. 1 can be provided in a memory module, in which multiple memory devices are integrated into a package (e.g., mounted on a printed circuit board) with a standard edge connector (e.g., DIMM edge connector) and a standard host-side interface. For example, FIG. 2 is a simplified block diagram schematically illustrating a memory system 200 in accordance with an embodiment of the present technology. Memory system 200 includes a host device 210 operably coupled to a memory module 220 (e.g., a dual in-line memory module (DIMM)). Memory module 220 can include a buffering device 230 operably connected by a bus 240 to a plurality of memory devices 250. In accordance with one aspect of the present disclosure, the buffering device 230 can provide a standards-compliant host-side interface to host 210 while permitting memory devices with a variety of different formats, physical dimensions (e.g., densities) and functional capabilities to be connected via bus 240.

In accordance with one example, the memory devices 250 of memory module 220 may include one or more chip-scale packaged memory devices, consuming less real estate on the printed circuit board of the memory module 220 than in other packaging approaches, and can be connected via one of several different bus solutions (e.g., multiplexing and/or first-in, first-out (FIFO)) with independent data channels for communicating with the memory devices 250. Moreover, the buffering device 230 can include logic configured to perform a variety of functions in the memory devices 250, including processing in memory (PIM), atomic operations, and the like. The buffering device 230 can further include logic 'offloaded' from the memory devices 250, permitting the use of 'dumb' memory arrays (e.g., lacking the error correcting code (ECC) of standard DRAM modules).

In accordance with one aspect of the present disclosure, the buffering device 230 is configured to manage all the memory devices 250 (e.g., optimizing traffic to reduce latency and power), and to provide enhancements to the host-side interface through expanded memory functionality (e.g., in-memory operations such as atomic operations and processing in memory). By way of analogy, the buffering device 230 can function as a "black box" memory controller with an independent interface to host. The black box approach permits the use of any memory technology or technologies (e.g., various volatile and non-volatile memory mixes).

For example, in one embodiment of the present technology, the buffering device 230 can be configured to manage refresh cycles as required by one or more of the memory devices 250 (e.g., in the absence of refresh commands from the host 210, even for DDR5 implementations that would otherwise require the host 210 to issue them). In another embodiment, the buffering device 230 can be configured to predict the location of a next memory access (e.g., using snooping commands, memory access history, and other predictive intelligence approaches) to optimize refresh locations, pre-condition arrays or perform other optimizations based upon the prediction.

In accordance with one aspect of the present technology, the buffering device 230 can include circuitry configured to optimize the power consumption of the memory devices 250 (e.g., by variously shutting them down, changing their operating voltages, changing their clock rates, etc.). Moreover, the buffering device can be configured to manage the physical media of the memory devices (e.g., mapping out bad bits, rows, sections, and the like, and transferring the contents thereof to known good areas, transparently to host).

In accordance with yet another aspect of the present technology, the buffering device 230 can be used in place of traditional memory I/O drivers, termination circuitry, DLLs, ECC/CRC encoding/decode circuitry, and command decode logic from each of the memory devices 250 (e.g., permitting the omission of these and other logic circuits from the memory devices 250 that would otherwise be present in traditional DRAM die). In another embodiment of the present disclosure, the buffering device 230 can be configured as a level shifted, so that in embodiments in which the memory devices 250 are packaged DRAM dies, the DRAM I/O voltage and/or power can be reduced.

In another embodiment of the present disclosure, the buffering device 230 may be configured to support parallel channels to the memory devices 250 to promote lower latency. Accordingly, in some embodiments, the data communicated over the data bus may be non-deterministic. In accordance with another aspect, signaling between the buffering device 230 and the memory devices 250 could be more advanced than non-return-to-zero (NRZ) or other binary logic, in order to achieve higher internal bandwidth (e.g., in some embodiments, as high or even higher than the external bandwidth).

In view of the foregoing capabilities of the buffering device 230, the memory devices 250 can be provided in a variety of formats, capacities, and with various functionality included or omitted. For example, tiered memory can be provided behind the buffering device 230, in which latency corresponds to address location, and the host device 210 could therefore be configured to direct "hot" data (e.g., data expected to be read back more quickly after writing, or more frequently than other data) in lower latency addresses. In this respect, hot address locations could also be configured to have priority over any other data request (e.g., requests to access hot locations could be reordered to the front of the request queue, and/or provided as an interrupt that would postpone any other access in process).

Moreover, the foregoing capabilities could be further exploited by utilizing an addressing scheme that corresponds to memory arrays with different bus widths or page sizes (e.g., address 0x0=16 bits wide, 0x5=32 bits wide, 0xA=64 bits wide, etc.) to save power and improve efficiency. In a traditional system with channels that only support a 128 bit packet, in a circumstance in which 64 bits of data are requested, the system would have to access the full 128 bits of bandwidth. In an embodiment of the present disclosure, different arrays, or sections of arrays could be configured with different bus widths and page sizes (e.g., in an approach not entirely dissimilar to burst chop in DDR, which truncates data, but which does not provide the capability of the present approach to change the timing or power utilized to access data).

Although the memory system in FIG. 2 has been described and illustrated with respect to a memory module, in other embodiments of the present technology, other memory packages or systems may be utilized (e.g., surface-mount packages, flip-chip packages, ball grid array packages, etc.). Moreover, although the foregoing embodiments have been described with reference to industry-standards compliant connectors, interfaces and protocols, in still other embodiments, memory systems, modules and devices employing a buffering device can be provided in proprietary or custom formats.

Figure 3:
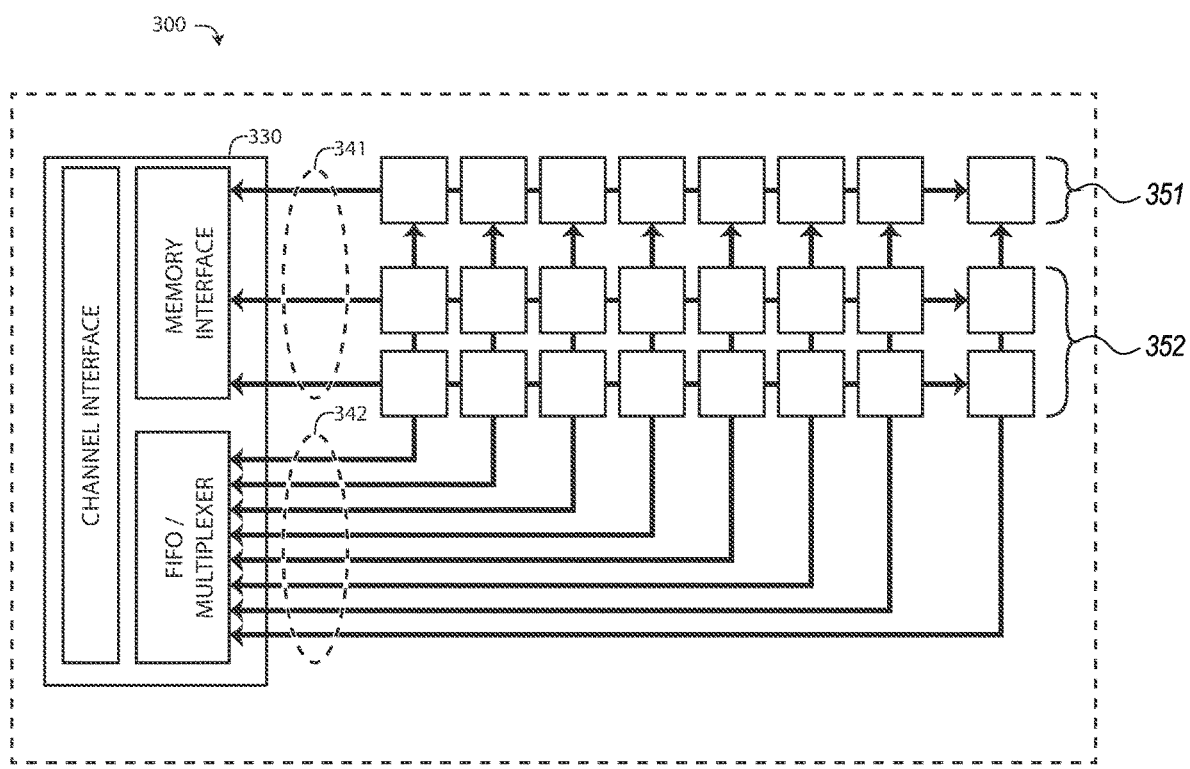
FIG. 3 is a simplified block diagram schematically illustrating a memory device in accordance with an embodiment of the present technology.

FIG. 3 is a simplified block diagram schematically illustrating a memory device in accordance with an embodiment of the present technology. As can be seen with reference to FIG. 3, memory device 300 can include a buffering device 330 and a plurality of memory devices, such as memory devices 351 and 352. In accordance with one embodiment of the present disclosure, the plurality of memory devices can include memory devices having different memory devices. For example, in such an embodiment, memory devices 351 can be non-volatile memory devices (e.g., NAND, PCM, NOR, MRAM, FeRAM, etc.) and memory devices can be volatile memory devices (e.g., DRAM, SRAM, etc.). Buffering device 330 can include a variety of circuitry configured to permit communication between a connected host device (not illustrated) and the various memory device 351 and 352, including a channel interface (e.g., for command/address and data communication with the connected host device using a standard memory protocol, such as DDR5 or the like), a memory interface (e.g., for command/address communication between the buffering device 330 and the memory devices over a command/address bus 341, and for performing logic functions such as ECC, processing-in-memory and/or atomic operations therein), and a FIFO circuit and/or one or more multiplexers (e.g., for data communication between the buffering device 330 and the memory devices over a data bus 342).

In accordance with one aspect of the present disclosure, the command/address bus 341 can include a plurality of independent control lines, each operably coupling the memory interface to a corresponding subset (e.g., illustrated as a row) of the plurality of memory devices. Similarly, the data bus 342 can include a plurality of independent data channels, each operably coupling the FIFO and/or multiplexer(s) to a corresponding subset (e.g., illustrated as a column) of the plurality of memory devices. As can be seen with reference to FIG. 3, the subset of memory devices (e.g., column) to which each independent data channel is connected can include memory devices of more than one type (e.g., one non-volatile memory device 351 and two volatile memory devices 352), whereas the subset of memory devices (e.g., row) to which each independent control line is connected includes memory devices of a single type (e.g., all non-volatile memory devices 351 or all two volatile memory devices 352).

Figure 4:
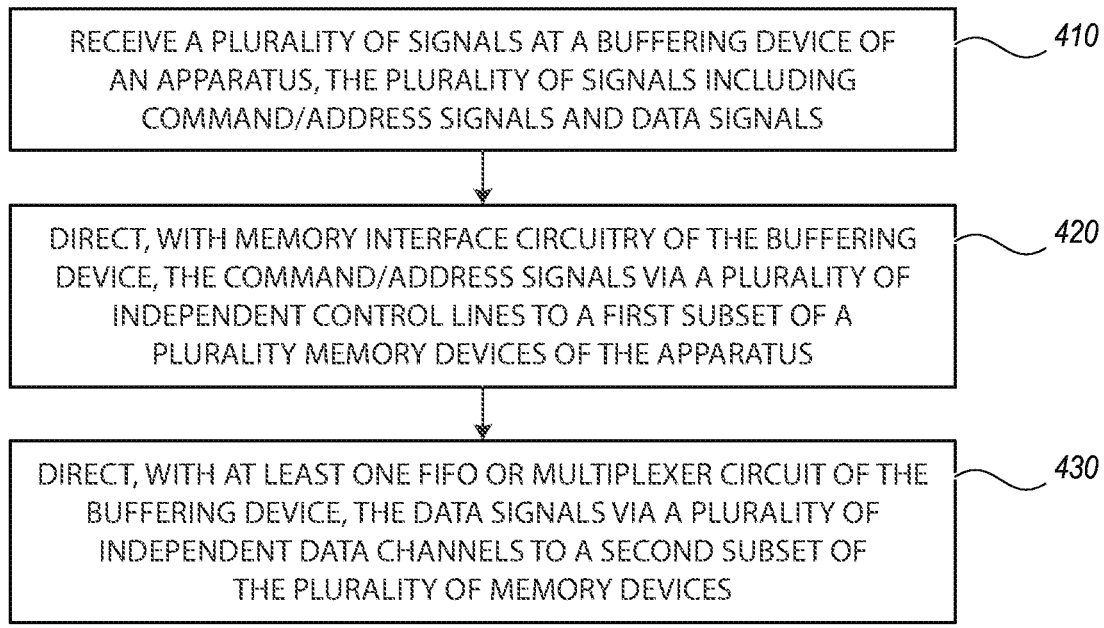
FIG. 4 is a flow chart illustrating a method of operating an apparatus in accordance with an embodiment of the present technology.

FIG. 4 is a flow chart illustrating a method of operating an apparatus in accordance with an embodiment of the present technology. The method includes receiving a plurality of signals at a buffering device of an apparatus, the plurality of signals including command/address signals and data signals (box 410). According to one aspect of the present disclosure, the receiving features of box 410 may be implemented with a buffering device 330, as illustrated in FIG. 3 in greater detail, above. The method further includes directing, with memory interface circuitry of the buffering device, the command/address signals via a plurality of independent control lines to a first subset of a plurality memory devices of the apparatus (box 420). According to one aspect of the present disclosure, the directing features of box 420 may be implemented with memory interface circuitry of a buffering device 330, as illustrated in FIG. 3 in greater detail, above. The method further includes directing, with at least one first-in first-out (FIFO) circuit or multiplexer circuit of the buffering device, the data signals via a plurality of independent data channels to a second subset of the plurality of memory devices (box 430). According to one aspect of the present disclosure, the directing features of box 430 may be implemented with a FIFO circuit and/or a multiplexer circuit of a buffering device 330, as illustrated in FIG. 3 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. An apparatus comprising:
   a plurality of memory devices;
   memory interface circuitry; and
   a parallel bus operably connecting the memory interface circuitry to the plurality of memory devices, the parallel bus including:
      a plurality of independent control lines, each of the plurality of independent control lines operably coupling the memory interface circuitry to a corresponding subset of a plurality of first subsets of the plurality of memory devices, and
      a plurality of independent data channels, each of the plurality of independent data channels operably coupling the memory interface circuitry to a corresponding subset of a plurality of second subsets of the plurality of memory devices,
   wherein each of the plurality of first subsets intersects each of the plurality of second subsets, and
   wherein each of the second subsets of the plurality of memory devices includes memory devices having different memory types.

2. The apparatus of claim 1, wherein each of the first subsets of the plurality of memory devices includes memory devices of a single memory type.

3. The apparatus of claim 1, wherein the different memory types comprise one or more of NAND, NOR, phase change memory (PCM), magnetoresistive memory (MRAM), DRAM, SRAM, or ferroelectric memory, or any combination thereof.

4. The apparatus of claim 1, wherein the memory interface circuitry includes a channel interface configured to communicate with a connected host device using a DDR5 protocol.

5. The apparatus of claim 1, wherein the memory interface circuitry is configured to perform processing in memory functions in one or more of the plurality of memory devices.

6. The apparatus of claim 1, wherein the memory interface circuitry is configured to perform atomic memory functions in one or more of the plurality of memory devices.

7. The apparatus of claim 1, wherein the plurality of memory devices includes chip scale packaging memory devices.

8. The apparatus of claim 1, wherein the plurality of memory devices includes one or more memory devices lacking error correcting code (ECC) circuitry, and further wherein the memory interface circuitry is to perform error correcting in the one or more memory devices.

9. The apparatus of claim 1, wherein the memory interface circuitry is configured to map physical addresses of the plurality of memory devices to logical addresses.

10. The apparatus of claim 1, wherein the memory interface circuitry is configured to remap physical addresses of the plurality of memory devices in response to a detection of a bad bit in one or more of the plurality of memory devices.

11. A method, comprising:
   receiving a plurality of signals at memory interface circuitry of an apparatus, the plurality of signals including command/address signals and data signals;
   directing, with the memory interface circuitry, the command/address signals via a plurality of independent control lines to a first subset of a plurality memory devices of the apparatus;
   directing, with the memory interface circuitry, the data signals via a plurality of independent data channels to a second subset of the plurality of memory devices,
   wherein each of the plurality of first subsets intersects each of the plurality of second subsets, and
   wherein the second subset of the plurality of memory devices includes memory devices having different memory types.

12. The method of claim 11, wherein the first subset of the plurality of memory devices includes memory devices of a single memory type.

13. The method of claim 11, wherein the different memory types comprise one or more of NAND, NOR, phase change memory (PCM), magnetoresistive memory (MRAM), DRAM, SRAM, or ferroelectric memory, or any combination thereof.

14. The method of claim 11, wherein the plurality of signals is communicated from a connected host device using a DDR5 protocol.

15. The method of claim 11, further comprising performing, with the memory interface circuitry, processing-in-memory functions in one or more of the plurality of memory devices.

16. The method of claim 11, further comprising performing, with the memory interface circuitry, atomic memory functions in one or more of the plurality of memory devices.

17. The method of claim 12, wherein the plurality of memory devices includes chip scale packaging memory devices.

18. The method of claim 12, wherein the plurality of memory devices includes one or more memory devices lacking error correcting code (ECC) circuitry, and further comprising performing, with the memory interface circuitry, error correcting functions in the one or more memory devices.

19. The method of claim 11, further comprising mapping, with the memory interface circuitry, physical addresses of the plurality of memory devices to logical addresses.

20. The method of claim 11, further comprising remapping, with the memory interface circuitry, physical addresses of the plurality of memory devices in response to a detection of a bad bit in one or more of the plurality of memory devices.

21. An apparatus, comprising:
   a plurality of memory devices arranged into a first channel and a second channel;
   first and second memory interface circuitries corresponding to the first and second channels, respectively; and
   a parallel bus operably connecting the first and second memory interface circuitries to memory devices of the first and second channels, respectively, the parallel bus including:
      a plurality of independent control lines, each of the plurality of independent control lines operably coupling one of the first and second memory interface circuitries to a corresponding subset of a plurality of first subsets of the plurality of memory devices, and
      a plurality of independent data channels, each of the plurality of independent data channels operably coupling one of the first and second memory interface circuitries to a corresponding subset of a plurality of second subsets of the plurality of memory devices,
   wherein each of the plurality of first subsets intersects each of the plurality of second subsets, and
   wherein each of the plurality of second subsets includes memory devices having different memory types.

* * * * *